United States Patent
Gillett et al.

(10) Patent No.: US 6,756,658 B1
(45) Date of Patent: Jun. 29, 2004

(54) MAKING TWO LEAD SURFACE MOUNTING HIGH POWER MICROLEADFRAME SEMICONDUCTOR PACKAGES

(75) Inventors: Blake A. Gillett, Gilbert, AZ (US); Sean T. Crowley, Phoenix, AZ (US); Bradley D. Boland, Gilbert, AZ (US); Keith M. Edwards, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 235 days.

(21) Appl. No.: 09/827,791

(22) Filed: Apr. 6, 2001

(51) Int. Cl.[7] .............................................. H01L 23/495
(52) U.S. Cl. ....................... 257/666; 257/669; 257/670; 257/674; 257/676
(58) Field of Search ................................ 257/666, 669, 257/670, 674, 676

(56) References Cited

U.S. PATENT DOCUMENTS

| | | | |
|---|---|---|---|
| 3,838,984 A | 10/1974 | Crane et al. | 29/193.5 |
| 4,530,152 A | 7/1985 | Roche et al. | 29/588 |

(List continued on next page.)

FOREIGN PATENT DOCUMENTS

| | | | | |
|---|---|---|---|---|
| DE | 19734794 A1 | 8/1997 | ........... | H01L/23/50 |
| EP | 0794572 A2 | 9/1997 | ......... | H01L/23/495 |
| JP | 55-163868 | 12/1980 | ........... | H01L/23/48 |
| JP | 59-227143 | 12/1984 | ........... | H01L/23/12 |
| JP | 60-52050 | 3/1985 | ........... | H01L/23/48 |
| JP | 60-195957 | 10/1985 | ........... | H01L/23/48 |
| JP | 61-39555 | 2/1986 | ........... | H01L/23/36 |
| JP | 62-9639 | 1/1987 | ........... | H01L/21/56 |
| JP | 63-205935 | 8/1988 | ........... | H01L/23/28 |
| JP | 63-233555 | 9/1988 | ........... | H01L/23/30 |
| JP | 6-54749 | 3/1989 | ........... | H01L/23/28 |
| JP | 6092076 | 4/1995 | ........... | B42D/15/10 |
| JP | 7-312405 | 11/1995 | ........... | H01L/23/50 |
| JP | 8-125066 | 5/1996 | ........... | H01L/23/12 |
| JP | 8-306853 | 11/1996 | ........... | H01L/23/50 |
| JP | 9-8205 | 1/1997 | ........... | H01L/23/50 |
| JP | 9-8206 | 1/1997 | ........... | H01L/23/50 |
| JP | 9-8207 | 1/1997 | ........... | H01L/23/50 |
| JP | 9-92775 | 4/1997 | ........... | H01L/23/50 |
| JP | 57-45959 | 3/1998 | ........... | H01L/23/28 |
| KR | 92-10286 | 6/1992 | ........... | H01L/21/56 |
| KR | 94-1979 | 1/1994 | ........... | H01L/21/56 |
| KR | 96-9774 | 4/1996 | ........... | H01L/23/50 |
| KR | 97-72358 | 11/1997 | ........... | H01L/23/50 |

OTHER PUBLICATIONS

Mannion, P., "Mosfets Break Out Of The Shackles Of Wirebonding", Electronic Design, vol. 47, No. 6 (Mar. 22, 1999).

(List continued on next page.)

*Primary Examiner*—Bradley Baumeister
*Assistant Examiner*—Matthew E. Warren
(74) *Attorney, Agent, or Firm*—Stetina Brunda Garred & Brucker

(57) ABSTRACT

A two-lead, surface-mounting, high-power micro-leadframe semiconductor package has the same outline, mounting, and electrical functionality as industry standard leadframe packages but provides a lower internal resistance, a higher package power rating, and costs less to produce. The novel package incorporates one of a rectangular array of "micro-leadframes" ("MLFs"), each having parallel and respectively coplanar upper and lower surfaces etched in a plate having a uniform thickness. Each micro-leadframe includes an I-shaped die pad having a head, a foot, and opposite sides. First and second leads are disposed at the foot of the die pad, each having a side aligned with one of the sides of the pad. The second lead has an right-angled wire-bonding pad next to the die pad. A portion of a lower surface of each of the die pad and the leads is exposed through a lower surface of an envelope of plastic molded on the package to define package input/output terminals.

20 Claims, 4 Drawing Sheets

U.S. PATENT DOCUMENTS

| | | | |
|---|---|---|---|
| 4,707,724 A | 11/1987 | Suzuki et al. | 357/71 |
| 4,756,080 A | 7/1988 | Thorp, Jr. et al. | 29/827 |
| 4,812,896 A | 3/1989 | Rothgery et al. | 357/70 |
| 5,041,902 A | 8/1991 | McShane | 357/79 |
| 5,157,480 A | 10/1992 | McShane et al. | 357/74 |
| 5,172,213 A | 12/1992 | Zimmerman | 257/796 |
| 5,172,214 A | 12/1992 | Casto | 257/676 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,258,094 A | 11/1993 | Furui et al. | 156/634 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,294,897 A * | 3/1994 | Notani et al. | 257/676 |
| 5,332,864 A | 7/1994 | Liang et al. | 174/52.4 |
| 5,336,931 A | 8/1994 | Juskey et al. | 257/787 |
| 5,343,076 A | 8/1994 | Katayama et al. | 257/717 |
| 5,406,124 A | 4/1995 | Morita et al. | 257/783 |
| 5,424,576 A | 6/1995 | Djennas et al. | 257/666 |
| 5,435,057 A | 7/1995 | Bindra et al. | 29/830 |
| 5,521,429 A | 5/1996 | Aono et al. | 257/676 |
| 5,604,376 A | 2/1997 | Hamburgen et al. | 257/676 |
| 5,608,267 A | 3/1997 | Makulikar et al. | 257/796 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,646,831 A | 7/1997 | Manteghi | 361/813 |
| 5,650,663 A | 7/1997 | Parthasarathi | 257/706 |
| 5,683,806 A | 11/1997 | Sakumoto et al. | 428/343 |
| 5,696,666 A | 12/1997 | Miles et al. | 361/764 |
| 5,701,034 A | 12/1997 | Marrs | 256/706 |
| 5,710,064 A | 1/1998 | Song et al. | 437/220 |
| 5,736,432 A | 4/1998 | Mackessy | 438/123 |
| 5,776,798 A | 7/1998 | Quan et al. | 438/112 |
| 5,783,861 A | 7/1998 | Son | 253/693 |
| 5,814,884 A | 9/1998 | Davis et al. | 257/723 |
| 5,835,988 A | 11/1998 | Ishii | 257/684 |
| 5,844,306 A * | 12/1998 | Fujita et al. | 257/666 |
| 5,859,471 A | 1/1999 | Kuraishi et al. | 256/666 |
| 5,866,939 A | 2/1999 | Shin et al. | 257/666 |
| 5,877,043 A | 3/1999 | Alcoe et al. | 438/123 |
| 5,894,108 A | 4/1999 | Mostafazadeh et al. | 174/52.4 |
| 5,973,388 A * | 10/1999 | Chew et al. | 257/666 |
| 5,977,613 A | 11/1999 | Takata et al. | 257/666 |
| 5,977,630 A | 11/1999 | Woodworth et al. | 257/712 |
| 5,981,314 A | 11/1999 | Glenn et al. | 438/127 |
| 6,001,671 A | 12/1999 | Fjelstad | 438/112 |
| 6,025,640 A | 2/2000 | Yagi et al. | 257/666 |
| 6,040,626 A | 3/2000 | Cheah et al. | 257/735 |
| 6,130,115 A | 10/2000 | Okumura et al. | 438/124 |
| 6,130,473 A | 10/2000 | Mostafazadeh et al. | 257/666 |
| 6,143,981 A | 11/2000 | Glenn | 174/52.4 |
| 6,198,171 B1 | 3/2001 | Huang et al. | 257/787 |
| 6,229,200 B1 | 5/2001 | Mclellan et al. | 257/666 |
| 6,242,281 B1 | 6/2001 | Mclellan et al. | 438/106 |
| 6,256,200 B1 | 7/2001 | Lam et al. | |
| 6,281,566 B1 * | 8/2001 | Magni | 257/666 |
| 6,384,472 B1 * | 5/2002 | Huang | 257/676 |

OTHER PUBLICATIONS

Glenn et al., USSN 09/176,614, Filed Oct. 21, 1998 entitled "Plastic Integrated Circuit Device Package and Micro–Leadframe and Method for Making the Package".

Glenn, Thomas P., USSN 09/324,710, Filed Jun. 3, 1999 entitled "Plastic Package for an Optical Integrated Circuit Device and Method of Making".

JEDEC Solid State Product Outline, "2 Lead Header Family Surface Mounted (Peripheral Terminals)", 4 pages.

* cited by examiner

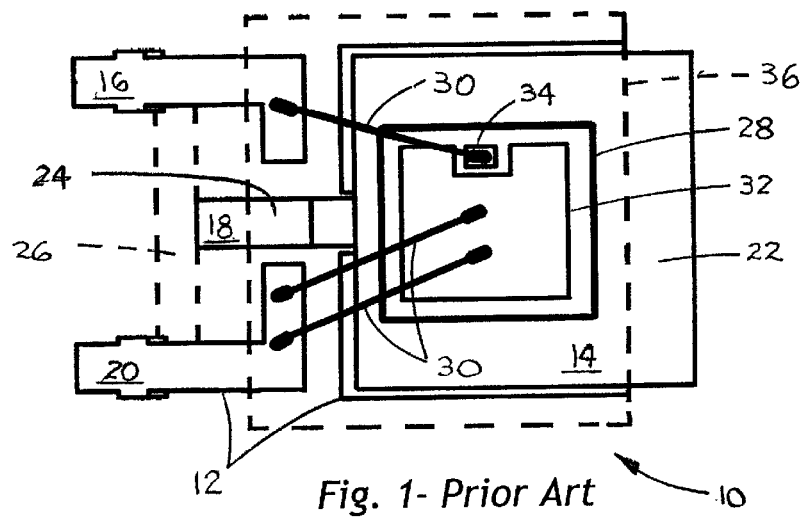
Fig. 1- Prior Art
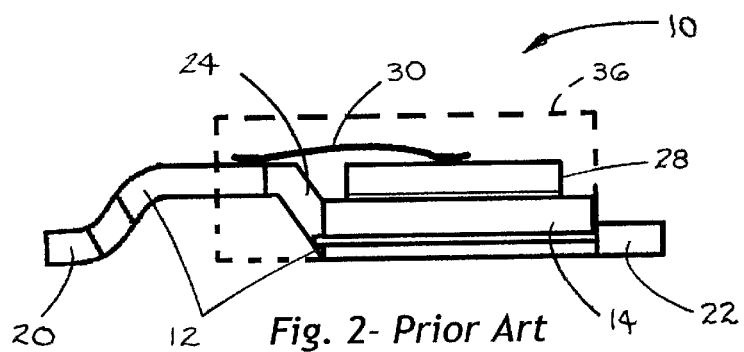
Fig. 2- Prior Art
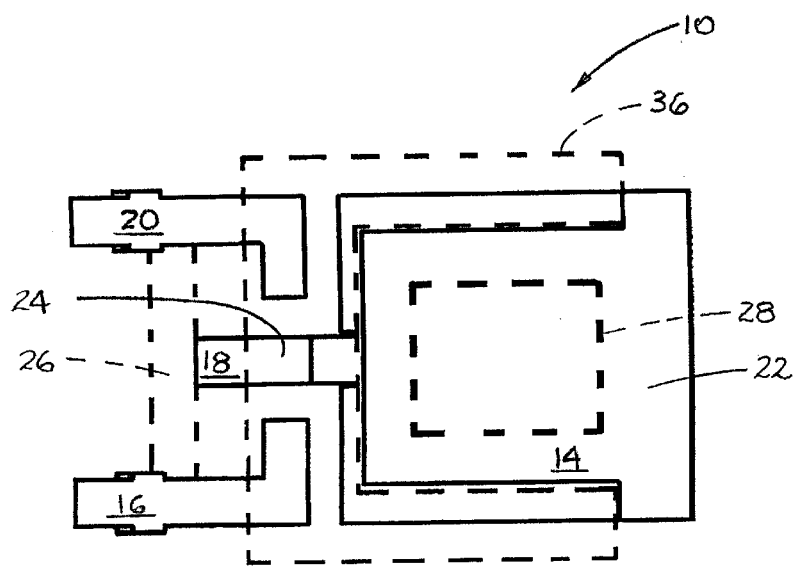
Fig. 3- Prior Art

MAKING TWO LEAD SURFACE MOUNTING HIGH POWER MICROLEADFRAME SEMICONDUCTOR PACKAGES

BACKGROUND

1. Technical Field

This invention pertains to the semiconductor packaging art in general, and in particular, to making two-lead, surface-mounting, high-power, micro-leadframe semiconductor packages having enhanced power ratings and lower manufacturing costs.

2. Related Art

In a known type of high-power, metal-oxide-semiconductor field effect transistor ("MOSFET") device, a number of lower-power devices are formed in a single semiconductor die, or "chip," and the respective "gate" and "source" terminals of the devices are all formed on the top of the die and respectively connected in parallel by thin metal pads on the top surface of the die, which in turn, are internally connected, typically by wire bonds, to respective leads of the device package.

The "drain" terminals of the individual devices are all respectively formed on the bottom of the die, and are connected in parallel by a thin metal pad on the bottom surface of the die, which in turn, is internally connected, typically by solder, to a metal die-mounting pad, which then constitutes a third "lead," or terminal, of the package. Other types of two- and three-terminal, high-power electronic devices can be made in a similar fashion.

An industry standard TO-252 "two-lead header," surface-mounting, highpower, leadframe semiconductor package 10 adapted to accommodate the above types of devices is illustrated in the top plan, side elevation, and bottom plan views of FIGS. 1–3, respectively, in which a protective plastic envelope 36 molded over the device is shown by a dashed line to reveal the underlying details thereof. The standard package 10, sometimes referred to as a "Dpak" package, is similar to other standardized two-lead, surface-mounting packages of a known type in the industry, viz., the TO-263 ("D2pak") and the TO-268 ("D3pak") outline packages.

The lead frame 12 of the standard package 10 comprises a rectangular die pad 14, three leads 16, 18 and 20, and a "header" 22 that are typically die-stamped from a dual-gage metal sheet, e.g., copper. A first, down-set tie-bar 24 permanently connects the vestigial center lead 18 to the die pad 14, and a second, transverse tie-bar 26 (shown by dashed lines) temporarily connects the three leads 16, 18, and 20 together until the package is molded over with plastic, and is then cut away and discarded.

A semiconductor die 28 incorporating an electronic device of the type described above is mounted on the upper surface of the die pad 14 with its lower surface in electrical connection therewith, and a plurality of wire bonds 30 are connected between bonding pads 32 and 34 on the upper surface of the die 28 and right-angled wire bonding arms at the inner ends of each of the first and second leads 16 and 20, respectively, as described above. A protective plastic envelope 36 is molded over the leadframe 12, die 28, and wire bonds 30, and a lower surface of the die pad 14 is exposed through and flush with the envelope to constitute, along with the down-set first and second leads 16 and 20, a third, surface-mounting terminal of the package 10.

While the industry-standard package 10 provides a workable housing and mounting for the above-described types of high-power devices, it also includes some aspects that need improvement. In particular, the dual thickness leadframe 12 is relatively expensive to produce, and is limited to a single inline, or tandem, "strip" production method that is relatively cost-inefficient.

Also, the two leads 16 and 20 of the package 10 must be made relatively thin so that they can be formed in multiple planes, as shown in the figures, and as a result, their electrical conductivity is adversely reduced. Further, the length of the right-angled wire-bonding arms on the inner ends of the leads 16 and 20 is limited by the presence of the third, vestigial lead 18. As a consequence, only two small (0.008 in.) diameter wire bonds 30 can be made to the second lead 20 of the package, which adversely affects the internal resistance of the package in, e.g., a power MOSFET, resulting in a relatively high value for the internal resistance between the drain and the source of the device during operation ("$R_{DS(ON)}$"), and a concomitant lower power rating for the package.

A need therefore exists for a two-lead, surface-mounting, high-power, micro-leadframe semiconductor package that has the same outline, mounting, and electrical functionality as industry-standard power packages, but which has a higher package power rating and costs less to produce than such packages. This invention provides such a package and a method for making it.

SUMMARY

The novel package of the invention and the method for making it comprise providing a metal plate having a uniform thickness. A rectangular array of identical microstructures, each having parallel and respectively coplanar upper and lower surfaces, are formed in the plate, e.g. by photolithography and etching techniques. Each of the microstructures includes an I-shaped die pad having a head, a foot, and opposite sides. A first, elongate lead is disposed at the foot of the die pad. The first lead has a side aligned with one of the sides of the pad, a proximal end located next to the die pad, and an opposite, distal end. A second, L-shaped lead is also disposed at the foot of the die pad, on the other side thereof from the first lead. The second lead has a side aligned with the second side of the die pad, a proximal end; with an elongated right-angled wire-bonding arm thereon located next to the pad, and an opposite, distal end.

A plurality of disposable tie-bars temporarily couple the die pad and the leads of each microstructure together within the plate during fabrication of the packages. A recessed shoulder can be formed around at least a portion of the periphery of the lower surface of each of the die pad and the leads in each microstructure to provide enhanced moisture resistance of the package and adhesion with a protective plastic envelope molded on the package.

A semiconductor die is mounted with its lower surface on and in electrical connection with the upper surface of the die pad in each of the microstructures, such that the die pad comprises an electrical terminal of the resulting package, e.g., in a power MOSFET device, a drain terminal. A plurality of wire bonds is connected between pads on the upper surface of the dies in each of the microstructures and an upper surface of the proximal ends of each of associated ones of the first and second leads therein to complete the internal electrical connection of the dies. For example, in a power MOSFET package, a single wire bond is connected between a common gate pad on the upper surface of the die and the proximal end of the first lead, and as many as five wire bonds are connected between a common source pad on the die and the right-angled wire-bonding arm on the second lead of the package.

A protective envelope of plastic is molded over the die pad, the leads, the die, and the wire bonds in each of the microstructures in the plate, such that at least a portion of a lower surface of each of the die pads and the leads therein is exposed through a lower surface of a respective plastic envelope to form a separate, flush, surface-mounting terminal of the respective package. After the plastic envelopes are molded on the microstructures, the tie bars holding each microstructure in the plate are cut through around a periphery of the envelope of the respective package to singulate the package from the plate.

By utilizing a single, thicker gage of metal in a microleadframe design, rather than the thinner, dual-gage metal of the prior art die-stamped leadframe, and by assembling the packages in a large rectangular array, rather than in the single, inline strip of the prior art method, a substantial reduction in package manufacturing costs results. Additionally, the novel design affords nearly twice the lead thickness, and enables up to three more wire bonds of greater diameter to be made to the leads of the package, than in the industry standard packages. This results in a substantial reduction in the internal resistance, inductance, and capacitance in the package, and a corresponding substantial increase in its power rating.

A better understanding of the above and other features and advantages of the present invention may be obtained from a perusal of the detailed description below of some exemplary embodiments thereof, particularly if such perusal is made in conjunction with the figures of the appended drawings.

DESCRIPTION OF THE DRAWINGS

FIG. 1 is a top plan view of an industry standard TO-252 "two-lead header," surface-mounting, high-power, leadframe semiconductor package in accordance with the prior art;

FIG. 2 is a cross-sectional side elevation view of the prior art TO-252 package shown in FIG. 1;

FIG. 3 is a bottom plan view of the prior art TO-252 package;

DETAILED DESCRIPTION

Figure 4:
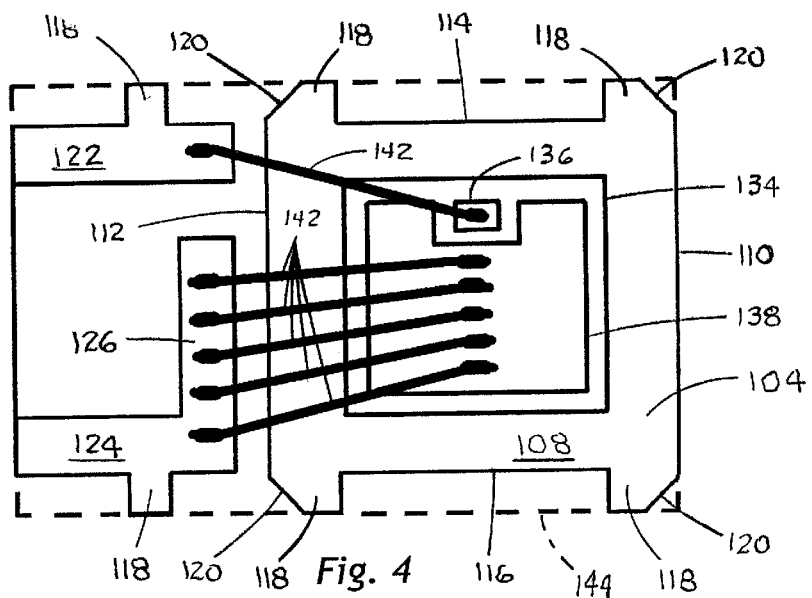
FIG. 4 is a top plan view of one embodiment of a two-lead, surface-mounting, high-power, micro-leadframe semiconductor package in accordance with the present invention.
Figure 5:
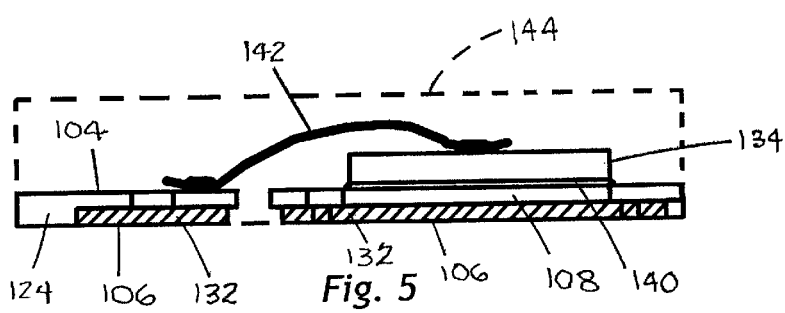
FIG. 5 is a cross-sectional side elevation view of the novel package shown in FIG. 4.
Figure 6:
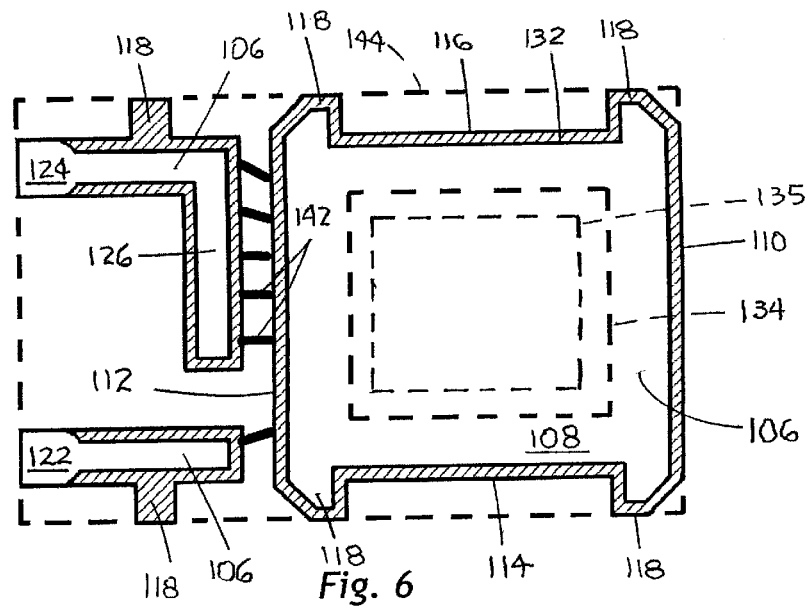
FIG. 6 is a bottom plan view of the novel package.
Figure 7:
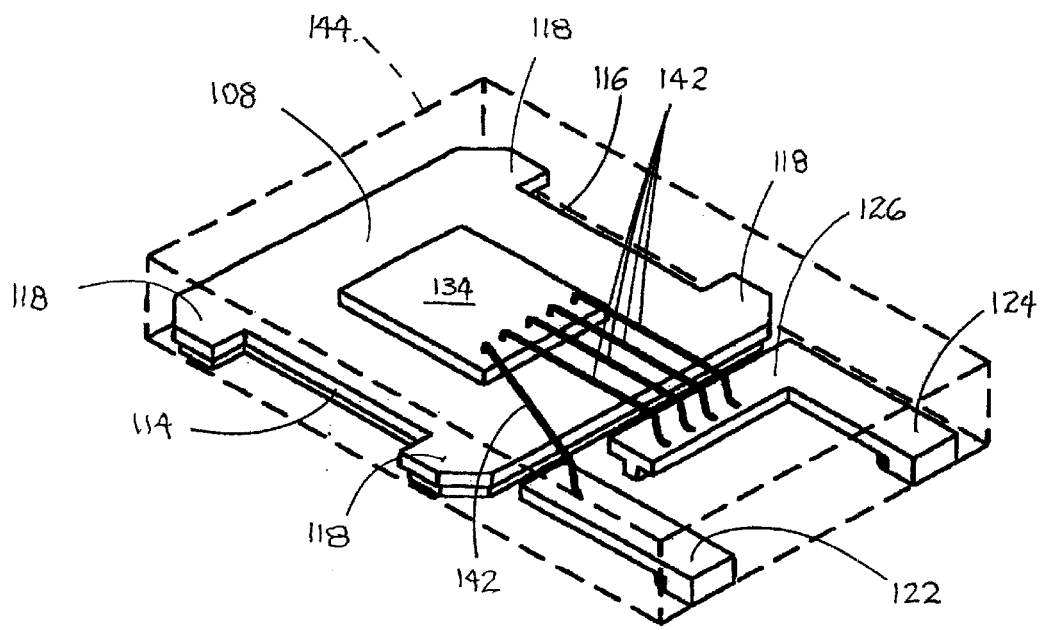
FIGS. 7 and 8 are respective top and bottom isometric views of the semiconductor package of the present invention.

An exemplary embodiment of a two-lead, surface-mounting, high-power, micro-leadframe semiconductor package 100 in accordance with the present invention is illustrated in the top plan, side elevation, and bottom plan views of the FIGS. 4–6, respectively, in which an envelope of plastic 144 that is molded over the package after the assembly thereof is shown as transparent, i.e., a dashed outline, to reveal the underlying details thereof.

The exemplary package 100 comprises a "microleadframe" ("MLF") 102, i.e., a microstructure having parallel and respectively coplanar upper and lower surfaces 104 and 106. The MLF 102 includes a rectangular, I-shaped die pad 108 having a head 110, a foot 112, and opposite first and second sides 114 and 116. The I-shape of the die pad 108 results from a recess, or set-back, in each of its two opposite sides 114 and 116 between the head 110 and foot 112 of the pad that partially define a tie-bar 118 at each side of both the head and the foot of the pad. A chamfer 120 at each of the four corners of the die pad 108 serve to reduce the area of the tie-bars 118, making them easier to cut through during package singulation, as described in more detail below.

A first, elongate lead 122 is disposed at the foot 112 of the die pad 108. The first lead 122 has a side aligned with the first side 114 of the die pad 108, a proximal end adjacent to the foot 112 of the pad, and an opposite, distal end extending away from the pad. A second, L-shaped lead 124 is also disposed at the foot 112 of the die pad 108, on the opposite, second side 116 thereof. The second lead 124 has a side aligned with the second side 116 of the die pad 108, a proximal end with a right-angled wire-bonding arm 126 thereon disposed adjacent to the pad, and an opposite, distal end extending away from the pad. Each of the first and second leads 122 and 124 has a tie-bar 118 on a respective side thereof similar to those on the die pad 108.

Figure 9:
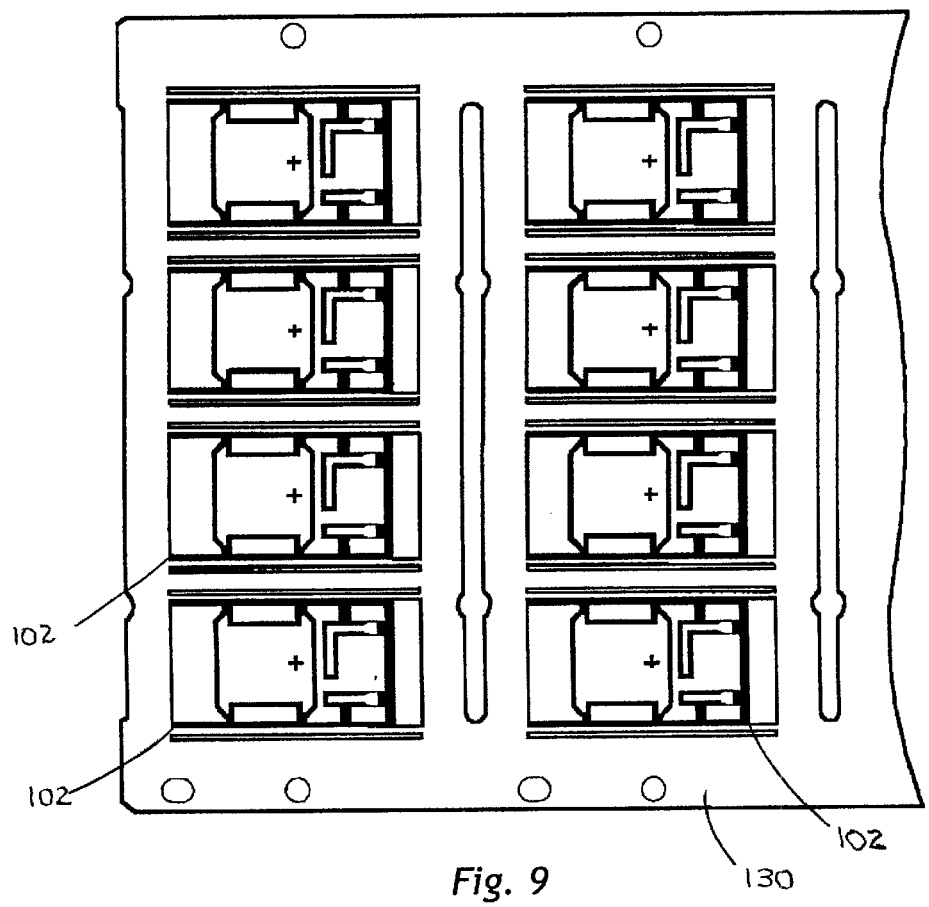
FIG. 9 is a top plan view of a section of a metal plate having a plurality of micro leadframes formed in it in accordance with an embodiment of this invention; and, FIG. 10 is an enlarged top plan view of one of the micro-leadframes broken out of the plate shown in FIG. 9.
Figure 10:
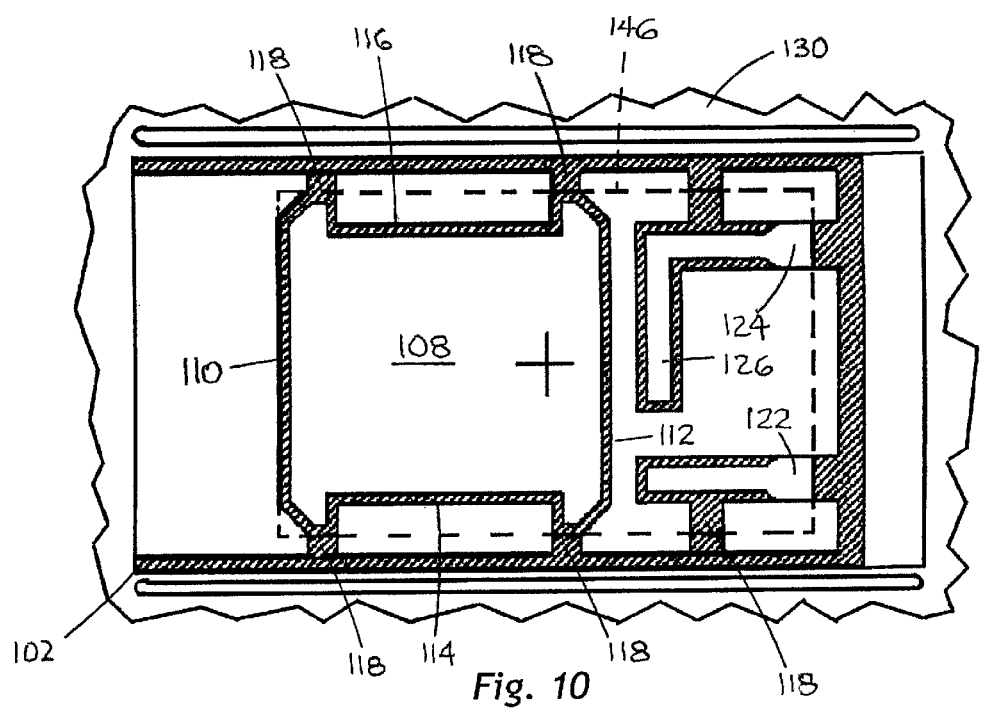

The MLF 102 can be manufactured with a variety of methods, and in one advantageous method of producing the package 100 of this invention, a rectangular array of identical MLFs 102 are simultaneously formed by etching them from a uniformly thick metal plate 130, as illustrated in FIGS. 9 and 10. In FIG. 9, a half-section of such a plate 130 is illustrated in which a total of 32 MLFs 130 are etched. FIG. 10 shows an enlarged top plan view of one of the MLFs 102 broken out from the plate 130. In one advantageous embodiment, the plate 130 is made of copper, or an alloy thereof, and has a uniform thickness of from about 0.020 to about 0.040 inches, i.e., from one to two times the thickness of the leads and header of the industry standard package 10 illustrated in FIGS. 1–3.

In an etching embodiment of the invention, a precise pattern of photoresist (not illustrated) corresponding to an outline of each of the MLFs 102 is photo-printed on the lower surface 106 of the plate 130, and the thickness of the plate is then etched through from the lower surface thereof with a directional-etching technique, e.g., a reaction-ion-etching ("R.I.E.") method, in areas where no photoresist is present, to define the die pad 108 and the leads 122 and 124, which are coupled within a rectangular framework in the plate by the tie-bars 118.

In a particularly advantageous alternative to the above embodiment, a first pattern of photoresist corresponding to the outline of the MLFs 102 is photo-printed on the lower surface 106 of the plate 130, and the lower surface of the plate is then etched as above, but only about half-way through its thickness. A second photo-resist pattern is then printed on the plate slightly outboard of the perimeter of the first pattern, as shown by the cross-hatched areas in FIG. 10, and the plate 130 is again etched, this time completely through its thickness, as above. This "halfetching" technique has certain advantages over the above, "single-etch" method: First, it produces a recessed shoulder 132 (shown cross-hatched in FIGS. 5 and 6) around a periphery of the lower surface of each of the die pad 108 and the leads 122 and 124, which serves both as a labyrinthine barrier to the penetration of moisture into the package 100 at the boundary between the MLF 102 and the protective plastic envelope 144 molded over the MLF, as well as a means for increasing the local surface bonding energy at that boundary for enhanced adhesion with the plastic. Second, it permits the elements of the MLF 102, such as the foot 112 of the die pad 108 and the right-angled wire bonding pad 126 on the second lead 124 to be spaced much more closely together, and with much greater precision of clearances, than would otherwise be possible if the plate 130 having the above thickness were etched through in a single step.

After the MLFs 102 have been etched in the plate 130 as shown in FIG. 9, it may be desirable in some applications to plate selected areas of the plate with, e.g., silver, gold, nickel, palladium, or the like, to facilitate wire-bonding and/or soldering to the MLFs. When the array of MLFs 102 has been etched and plated, a semiconductor die 134 comprising an electronic device of the type described above is mounted on the each of the die pads 108 in the array.

The electronic device in the die 134 may comprise, e.g., a high power MOSFET, an insulated gate bipolar transistor ("IGBT"), a bipolar junction transistor ("BJT"), a silicon controlled rectifier ("SCR," or "triac"), a diode rectifier, or any other such two- or three-terminal, high-power type of electronic device. As described above, such dies 134 typically incorporate a large metal pad 135 (shown by dashed outline in FIG. 6) on their lower surfaces that constitutes a drain terminal, in the case of a MOSFET; a collector terminal, in the case of an IGBT; an emitter terminal, in the case of a BJT; or a cathode, in the case of an SCR or diode rectifier.

The upper surface of the die 134 typically includes a small metal pad 136 (see FIG. 4), constituting a gate terminal, in the case of a MOSFET; a gate terminal, in the case of an IGBT; a base terminal, in the case of a BJT; or a "trigger" terminal, in the case of an SCR; and, a separate, much larger metal pad 138, constituting a source terminal, in the case of a MOSFET; an emitter terminal, in the case of an IGBT; a collector terminal, in the case of a BJT; or an anode terminal, in the case of an SCR or a diode rectifier.

Each die 134 is mounted with the metal pad 135 on its lower surface on and in electrical connection with the upper surface of a respective one of the die pads 108. This is advantageously effected with either a layer 140 (see FIG. 4) of solder or an electrically conductive adhesive. If a relatively low temperature soldering process is desired, a eutectic (63% Sn, 37% Pb) solder alloy, or other "soft solder," can be used to mount the die 134. If a relatively higher electrical conductivity is desired between the die 134 and the pad 108, other solder alloys, which typically have a higher liquidus temperature, may be used. In the latter case, it may be desirable to effect the soldering in a closed oven containing a reducing atmosphere, e.g., hydrogen, to avoid over-oxidizing the MLFs 102.

After the dies 134 are mounted on the die pads 108, a plurality of wire bonds 142, typically aluminum, are conventionally connected between the metal pads 136 and 138 on the upper surfaces of the dies and an upper surface of the proximal ends of each of the first and second leads 122 and 124 in each MLF 102. In most applications, the wire bonds 142 comprise a single wire bond between the small gate, base, or trigger pad 136 of the device, since this is typically a relatively low-current terminal of the device, and a relatively larger number of wire bonds between the source, emitter, collector, or anode pad 138 of the device, since this is typically a high-current terminal thereof. In the industry standard package 10 illustrated in FIGS. 1–3, the number of the wire bonds 142 between the high-current terminal 138 and the second lead 20 is limited to two wires, in a TO-252 (Dpak) package, and this number can be increased to only three of such wire bonds in a TO-263 (D2pak), or a TO-268 (D3pak) package.

However, because the package 100 of the present invention eliminates the center, vestigial lead 18 of the industry standard package 10 (see FIG. 1), the right-angled wire bonding arm 126 on the second lead 124 can be made much longer (see FIG. 4), thereby enabling up to five, larger diameter (viz., 0.008 in.) aluminum, gold, or copper wire bonds 142 to be made between the high-current pad 138 and the second lead 124 in all three standard TO-252, 263, and 268 outline packages. For smaller diameter wire bonds 142, this number can be increased even more. This increase in the number and diameter of the wire bonds 142 between the high-current pad 138 and the second lead 124 of the package 100, together with the increase in thickness of the leads of the package described above, results in up to an 80% decrease in the $R_{DS(ON)}$ for, e.g., a power MOSFET package, and a concomitant 40% increase in the power rating of the package, relative to the industry-standard package.

After the wire bonds 142 are connected, a protective envelope 144 of plastic, e.g., an epoxy resin, is molded over the die pad 108, the leads 122 and 124, the die 134, and the wire bonds 142 in each of the microstructures 102 such that at least a portion of a lower surface of each of the die pad and the leads in each microstructure is exposed through (and optionally, flush with) a lower surface of the envelope to constitute a respective input/output terminal of the package. Molding of the individual packages 102 in the plate 130 is followed by their singulation from the plate 130, which can be effected by cutting through the tie bars 118 in each microstructure around a periphery 146 (shown by dashed outline in FIG. 10) of the plastic envelope 144. The above method of producing the MLF packages 100 in a rectangular array format, and from a simple, uniformly thick metal plate 130, can result in up to a 50% reduction in the manufacturing cost of the individual packages, relative to the cost of the industry standard packages described above.

Figure 8:
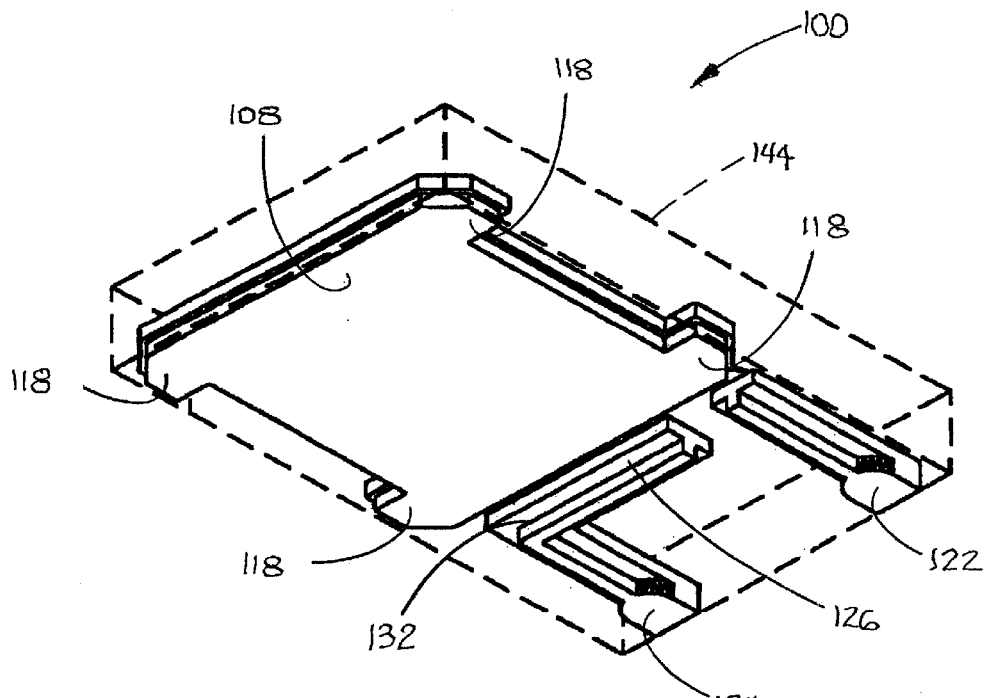

Thus, the resulting two-lead, surface-mounting, high-power, micro-leadframe semiconductor packages 100 of the present invention, as illustrated in the respective top and bottom isometric views thereof of FIGS. 8 and 9, have the same outline, mounting, and electrical functionality as the respective, industry-standard TO-252, TO-263, and TO-268 power packages, but yield a significantly higher power rating and cost significantly less to produce than such industry standard packages.

By now, those of skill in this art will appreciate that many variations and modifications are possible in the methods and materials of the present invention without departing from its spirit and scope. For example, the MLFs 102 need not necessarily be formed by etching, but can be formed by other techniques, e.g., die-stamping, coining, or electrical-discharge-machining ("EDM") techniques, and the MLF packages 100 can be tested and/or marked either before or after the packages are singulated from the plate 130.

Accordingly, the scope of the present invention should not be limited by that of the particular embodiments described and illustrated herein, as these are merely exemplary in nature, but rather, should be commensurate with that of the claims appended hereafter, and their functional equivalents.

We claim:

1. A leadframe for a two-lead, surface-mounting, high power semiconductor package, the leadframe comprising:
   a microstructure having parallel and respectively co-planar upper and lower surfaces, including:
      an I-shaped die pad having a head, a foot, and opposite first and second sides;
      an elongate, generally straight first lead disposed at the foot of the die pad, the first lead having a side aligned with the first side of the pad, a proximal end proximate to the die pad, and an opposite, distal end; and
      a generally L-shaped second lead disposed at the foot of the die pad, the second lead having a side aligned with the second side of the die pad, a proximal end, an opposite, distal end, and a wire bonding arm extending along-the die pad in spaced relation thereto, the wire bonding arm defining the proximal end of the second lead which is disposed proximate to the first lead.

2. The leadframe of claim 1, further comprising a plurality of disposable tie-bars temporarily coupling the die pad and the leads together within the microstructure.

3. The leadframe of claim 1, in which the microstructure is formed from a metal plate having a thickness of from about 0.020 to about 0.040 inches.

4. The leadframe of claim 1, in which a lower surface of each of the die pad and the leads includes a recessed shoulder formed around at least a portion of a periphery thereof.

5. A two-lead, surface mounting, high power semiconductor package, comprising:
   a microstructure having parallel and respectively co-planar upper and lower surfaces, including:
      an I-shaped die pad having a head, a foot, and opposite first and second sides;
      an elongate, generally straight first lead disposed at the foot of the die pad, the first lead having a side aligned with the first side of the pad, a proximal end proximate to the die pad, and an opposite, distal end;
      a generally L-shaped second lead disposed at the foot of the die pad, the second lead having a side aligned with the second side of the die pad, a proximal end, an opposite, distal end, and a wire bonding arm extending along the die pad in spaced relation thereto, the wire bonding arm defining the proximal end of the second lead which is disposed proximate to the first lead;
   a semiconductor die having a lower surface mounted on and in electrical connection with an upper surface of the die pad;
   a plurality of wire bonds connected between an upper surface of the die and an upper surface of each of the first and second leads; and
   an envelope of plastic molded over the die pad, the leads, the die, and the wire bonds such that at least a portion of a lower surface of each of the die pad and the leads is exposed through lower surface of the envelope.

6. The semiconductor package of claim 5, in which the microstructure is formed from a metal plate having a uniform thickness of from about 0.020 to about 0.040 inches.

7. The semiconductor package of claim 5, in which the lower surface of each of the die pad and the leads includes a recessed shoulder formed around at least a portion of a periphery thereof.

8. The semiconductor package of claim 5, in which the plurality of wire bonds comprises at least one wire bond between the die and the first lead and at least two or more wire bonds between the die and the wire bonding arm of the second lead.

9. The semiconductor package of claim 5, in which the semiconductor die is an electronic device selected from the group consisting of a metal oxide semiconductor field effect transistor ("MOSFET"), a insulated gate bipolar transistor ("IGBT"), a silicon controlled rectifier ("SCR), a bipolar junction transistor ("BJT"), or a diode rectifier.

10. A leadframe for a two-lead, surface-mounting, high power semiconductor package, the leadframe comprising:
   a die pad defining a head, a foot, and opposed, generally planar upper and lower surfaces;
   an elongate, generally straight first lead defining opposed proximal and distal ends and opposed, generally planar upper and lower surfaces, the proximal end of the first lead being disposed proximate to the foot of the die pad, with the upper surface of the first lead extending in generally co-planar relation to the upper surface of the die pad and the lower surface of the first lead extending in generally co-planar relation to the lower surface of the die pad; and
   a generally L-shaped second lead defining opposed proximal and distal ends, opposed, generally planar upper and lower surfaces, and a wire bonding arm extending along the die pad in spaced relation thereto and defining the proximal end of the second lead which is disposed proximate to the first lead, the upper surface of the second lead extending in generally co-planar relation to the upper surface of the die pad, with the lower surface of the second lead extending in generally co-planar relation to the lower surface of the die pad.

11. The lead frame of claim 10 wherein:
   the die pad has a generally I-shaped configuration defining opposed first and second sides which extend between the head and the foot thereof;
   the first lead defines a side which extends in aligned relation to the first side of the die pad; and
   the second lead defines a side which extends in aligned relation to the second side of the die pad.

12. The lead frame of claim 10 wherein the lower surface of the die pad, the lower surface of the first lead, and the lower surface of the second lead each include a recessed shoulder formed within at least a portion thereof.

13. The lead frame of claim 10 further comprising a plurality of disposable tie-bars coupling the die pad, the first lead, and the second lead to each other.

14. The lead frame of claim 10 wherein the die pad, the first lead, and the second lead are each formed from a metal plate having a thickness in the range of from about 0.020 inches to about 0.040 inches.

15. A two-lead, surface mounting, high power semiconductor package, comprising:
   a die pad defining a head, a foot, and opposed, generally planar upper and lower surfaces;
   an elongate, generally straight first lead defining opposed proximal and distal ends and opposed, generally planar upper and lower surfaces, the proximal end of the first lead being disposed proximate to the foot of the die pad, with the upper surface of the first lead extending in generally co-planar relation to the upper surface of the die pad and the lower surface of the first lead extending in generally co-planar relation to the lower surface of the die pad;
   a generally L-shaped second lead defining opposed proximal and distal ends, opposed, generally planar upper and lower surfaces, and a wire bonding arm extending along the die pad in spaced relation thereto and defining the proximal end of the second lead which is disposed proximate to the first lead, the upper surface of the second lead extending in generally co-planar relation to the upper surface of the die pad, with the lower surface of the second lead extending in generally co-planar relation to the lower surface of the die pad;

a semiconductor die disposed on and electrically connected to the upper surface of the die pad;

a plurality of wire bonds mechanically and electrically connected to and extending between the semiconductor die and the upper surfaces of respective ones of the first and second leads; and an envelope molded over the die pad, the first and second leads, the semiconductor die and the wire bonds such that at least a portion of the lower surface of the die pad and the lower surface of each of the first and second leads is exposed within the envelope.

16. The lead frame of claim 15 wherein:

the die pad has a generally I-shaped configuration defining opposed first and second sides which extend between the head and the foot thereof;

the first lead defines a side which extends in aligned relation to the first side of the die pad; and the second lead defines a side which extends in aligned relation to the second side of the die pad.

17. The lead frame of claim 15 wherein the lower surface of the die pad, the lower surface of the first lead, and the lower surface of the second lead each include a recessed shoulder formed within at least a portion thereof.

18. The semiconductor package of claim 15 wherein the wire bonds comprise:

at least one wire bond extending between the semiconductor die and the first lead; and at least two wire bonds extending between the semiconductor die and the wire bonding arm of the second lead.

19. The semiconductor package of claim 15 wherein the semiconductor die is selected from the group consisting of:

a metal oxide semiconductor field effect transistor;

an insulated gate bipolar transistor;

a silicon controlled rectifier;

a bipolar junction transistor; and a diode rectifier.

20. The lead frame of claim 15 wherein the die pad, the first lead, and the second lead are each formed from a metal plate having a thickness in the range of from about 0.020 inches to about 0.040 inches.

* * * * *